(12) United States Patent
Das

(10) Patent No.: US 6,957,057 B2
(45) Date of Patent: Oct. 18, 2005

(54) SWITCHED CAPACITOR MIXER CIRCUIT TO ATTAIN HIGH GAIN AND LINEARITY IN RADIO FREQUENCY RECEIVERS

(75) Inventor: Mrinal Das, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 487 days.

(21) Appl. No.: 10/123,377

(22) Filed: Apr. 16, 2002

(65) Prior Publication Data

US 2003/0119472 A1 Jun. 26, 2003

Related U.S. Application Data

(60) Provisional application No. 60/343,303, filed on Dec. 21, 2001.

(51) Int. Cl.[7] ............................. H04B 1/28; H03B 19/00
(52) U.S. Cl. ....................................... 455/333; 327/113
(58) Field of Search .................................. 455/313, 317, 455/323, 326, 333; 327/113

(56) References Cited

U.S. PATENT DOCUMENTS

| 5,483,696 | A | * | 1/1996 | Wheatley et al. ........... 455/318 |
| 5,805,988 | A | * | 9/1998 | Clayton et al. .............. 455/333 |
| 6,275,687 | B1 | * | 8/2001 | Lloyd .......................... 455/292 |
| 6,529,721 | B1 | * | 3/2003 | Tiller ........................... 455/323 |
| 6,665,527 | B2 | * | 12/2003 | Schiltz ........................ 455/326 |

* cited by examiner

*Primary Examiner*—Nguyen T. Vo
(74) *Attorney, Agent, or Firm*—Abdul Zindani; W. James Brady, III; Frederick J. Telecky, Jr.

(57) ABSTRACT

By implementing the sampling process at an AC ground node, rather than at a signal side, and adding a gated transistor (610 and 620) in the signal path, the present invention reduces the interdependency between gain and linearity in a switched capacitor mixer circuit, supplies higher power without sacrificing area and simplifies the implementation of the RF switch. Charge boosting circuitry (630) allows a reduction in the effective size of a series switch (610 and 620) that follows a transconductance element (115).

11 Claims, 4 Drawing Sheets

SWITCHED CAPACITOR MIXER CIRCUIT TO ATTAIN HIGH GAIN AND LINEARITY IN RADIO FREQUENCY RECEIVERS

This application claims the priority under 35 U.S.C. § 119(e)(1) of copending U.S. provisional application No. 60/343,303 filed on Dec. 21, 2001, and incorporated herein by reference.

FIELD OF THE INVENTION

The invention relates generally to radio frequency (RF) mixer circuits and, more particularly, to a new switched capacitor mixer circuit to attain high gain and linearity in radio frequency receivers.

BACKGROUND OF THE INVENTION

In the past few years, the growing demand for low voltage, low power, low cost and high performance mobile communications equipment has changed the way wireless receivers are designed. Complementary metal oxide semiconductor (CMOS) technology has become a practical contender for use in receiver design, especially because it lends itself to easier integration with digital ICs. However, usage of deep submicron CMOS technologies imposes an upper limit on the supply voltages that transistors can handle, therefore it is important to focus on low voltage design when designing RF CMOS circuits.

A typical, direct conversion (or low intermediate frequency (IF)) radio frequency (RF) receiver includes a front end low noise amplifier (LNA) followed by a mixer. The mixer output goes to a continuous time filter that performs the channel selection filtering. Most modem mixers used in current wireless receivers are based on the conventional Gilbert Cell mixer. FIG. 1 diagrammatically illustrates the basic architecture of a conventional continuous-time single balanced Gilbert cell mixer 100. The output voltage of LNA 110, which contains $RF_{in}$ 105, is converted to current by transconductance element 115. Transconductance element 115 can be implemented as a transistor with its gate coupled to an output of LNA 110 and its source coupled to voltage supply (VSS) 112. This current is then fed into two (2) parallel switches, 120 and 125, which are clocked by VLO− 130 and VLO+ 135, respectively. Switches 120 and 125 can be implemented as transistors with their sources both tied to the output of transconductance element 115. VLO− 130 and VLO+ 135 are produced by a local oscillator (LO). The drains of transistors 120 and 125 are coupled to voltage potential (VDD) 114 by a pair of load resistors, 140 and 145, respectively. This ensures that none of the input signal content is lost and that switches 120 and 125 perform the mixing function of the RF signal with the LO frequency. The mixing generates the multiplication of I(RF) with VLO at frequencies RF−LO (via switch 120 ) and RF+LO (via switch 125 ). Of these, RF−LO becomes the IF signal of interest. It is then filtered for appropriate channel selection by a filter (not shown) following mixer 100. After the multiplication, or mixing, by switches 120 and 125, the output current can be expressed as $i_{out}(t) = sgn[\cos \omega_{LO} t] \{I_{bias} + I_{RF} \cos \omega_{RF} t\}$, where $\omega_{RF}$ is the RF frequency and $\omega_{LO}$ is the frequency at which the LO (e.g., a voltage controlled oscillator (VCO)) is running.

One of the main difficulties with the implementation of the receive chain in a conventional continuous domain approach is that it requires high power and area, particularly for the baseband filter, in order to achieve sufficient dynamic range with all the process variations. For a conventional CMOS receiver, the majority of the power and area consumption is in the implementation of a continuous time filter with sufficient dynamic range and low noise. Recently, there have been several approaches to solving the high power requirement of CMOS receivers involving the implementation of the receive chain in a sampled domain switched capacitor approach.

In the conventional sampled domain switched capacitor approach, a single-ended LNA amplifies the RF signal and passes it to the mixer. The mixer then stores the sampled data points in a capacitor, rather than passing on a continuous domain signal. At the same time, several samples over the capacitor can be integrated to implement a filter within the mixer, acting as an anti-alias filter before the next stages. FIG. 2 is a block diagram of sampling architecture using a conventional switched capacitor approach. A signal received in block 210 is input to LNTA 220 which amplifies the signal before passing it to Multi-Tap Direct Sampling Mixers (MTDSM) 225 in block 200. Finally, the output of block 200 is demodulated by demodulator 230. One of the major bottlenecks of this architecture is that much of the linearity and gain are obtained simultaneously from mixers 225.

There have been two (2) published approaches to implementing the mixer in the switched capacitance domain. One uses the LNA to provide a voltage domain output. The other uses the LNA to not only provide a voltage domain output, but also as a voltage to current converter. The latter has been found to be more beneficial because it enables the implementation of an anti-alias filter by simply integrating several samples together on the capacitor. FIG. 3 diagrammatically illustrates a conventional approach to implementing mixer 300 in a switched capacitance domain. The output voltage of LNA 110, which contains $RF_{in}$ 105, is converted to current by transconductance element 115. Transconductance element 115 can be implemented as a transistor with its gate coupled to LNA_OUT 310 and its source coupled to voltage potential (VDD) 114. This current is then fed into two (2) parallel switches, 120 and 125, which are clocked by VLO− 130 and VLO+ 135, respectively. Switches 120 and 125 can be implemented as transistors with their drains both tied to the drain of transconductance element 115. VLO− 130 is applied at the gate of transistor 120, while VLO+ 135 is applied at the gate of transistor 125. The source of transistor 120 is tied to node 345, while the source of transistor 125 is tied to node 335. Capacitor 320 is coupled between node 345 and voltage source (VSS) 112. Capacitor 330 is coupled between node 335 and VSS 112. In this case, after the current is integrated over capacitors 320 and 330 by performing several consecutive samples, the overall integrated charge is transferred to stage 380, the IF amplifier feedback capacitance, by means of dump switches 340 and 350. Dump 340 is coupled between node 345 and input (INP) 360 of stage 380. Dump 350 is coupled between node 335 and input (INM) 370 of stage 380. Dumps 340 and 350 can be implemented as transistors with their drains tied to nodes 345 and 335, respectively, and their sources coupled to INP 360 and INM 370, respectively. The mixing is performed by sampling switches 120 and 125.

Although the requirement of high power and area for the filter in order to achieve high dynamic range and gain programmability can be avoided by implementing the full channel in switched capacitor or sampled domain, there remains a significant interdependency between gain and linearity: linearity of the mixer suffers as gain increases. There are two (2) main reasons why this interdependency occurs and why it is a problem. First, in a switched capacitor mixer, mixer 300 acts as the first switched capacitor block after continuous time LNA 110. This means that the linearity achievable from mixer 300 directly impacts the linearity of the full channel. Since mixer 300 is implemented by MOS switches 120 and 125 and capacitors 320 and 330, the circuit performance is limited by the existence of non-linear switch parasitics operating at very high RF frequencies. These parasitics destroy the advantages of implementing an RF switch at very high frequencies. Therefore, a reasonable gain and linearity can be achieved from mixer 300 only with a very low gain restriction to the LNA-mixer combination. The dynamic range of active components such as LNAs is typically defined on the low-output signal side by the noise figure (NF), and on the high-output signal side by intercept points (e.g., the intercept point second order, IP2, and the intercept point third order IP3). Intercept points indicate how much output level can be achieved before limitations occur due to undesired distortions. An intercept point is actually a fictitious, extrapolated point on an output versus input curve for a given device. Output level limitations may be manifested as nonlinearities in the response of a device, which in turn may appear as harmonics of an input signal. The second reason is that, for a direct conversion architecture, mixer 300 samples (or mixes) the RF input at the same RF frequency at the same time. At this frequency, the implementation of the switch is extremely difficult. This is a key issue when the amount of matching required between two (2) symmetrically placed switches 120 and 125 is considered. For the conventional architecture described above, the matching requirement for two (2) non-overlapping clocks at the positive, VLO+ 135, and negative, VLO− 130, arms of mixer 300 has been found to be less than 5 ps. This limitation is very problematical.

The main problem with the conventional sampling mixer, such as mixer 300, is the linearity of sampling switches 120 and 125. At the instant that each switch 120 and 125 is turning off, its transition is dependant on the absolute gain to the source voltage. If a large gain has been allowed in the LNA-mixer combination (i.e., integration occurred for a long duration), then the absolute voltage levels of capacitors 320 and 330 has become very high. Additionally, due to the existence of several blockers, the signal wave form has become highly amplitude modulated. This makes the "off" instance of each switch 120 and 125 a strong function of signal input $RF_{in}$ 105, leading to severe distortion (IP3 in this case). It has been observed that for such a structure, implemented in 0.15μ CMOS, if gate clocks VLO− 130 and VLO+ 135 are kept at a voltage of 1.5 volts, the dynamic range of each switch 120 and 125 starts degrading significantly as soon as the absolute voltage at the source and drain exceeds 50 mV. This effect can be verified by applying two (2) adjacent channel RF signals to the LNA inputs and observing the IP3 generated tone at the mixer output by using an ideal IF amplifier (dual tone test). The restriction of the maximum voltage at capacitors 320 and 330 limits the maximum gain achievable from the combination of LNA 110 and mixer 300. This makes the entire receiver less effective, since more gain in the LNA-mixer combination results in better overall noise performance in the subsequent blocks.

A similar situation arises due to the signal dependant clock feed-through. If the magnitude of the AC signal at each switch 120 and 125 changes by a large amount, the voltage that gets fed-through to capacitors 320 and 330 from each clock VLO− 130 and VLO+ 135, respectively, becomes signal dependant. This phenomena is also known as LO feed-through. It adds to the degradation of IP3 and also generates a strong "self-mixing" component within the desired channel. This also contributes to limiting the absolute gain in the LNA-mixer combination.

It is therefore desirable to provide a solution that reduces the interdependency between gain and linearity in a switched capacitor mixer circuit, supplies higher power without sacrificing area, and reduces the parasitic effects of the RF switch. The present invention achieves this by implementing the sampling process at the AC ground node, rather than at the signal side, and adding a gated transistor in the signal path. Charge boosting circuitry allows a reduction in the effective size of the series switch that follows the transconductance element.

BRIEF DESCRIPTION OF THE DRAWINGS

The above and further advantages of the invention may be better understood by referring to the following description in conjunction with the accompanying drawings in which corresponding numerals in the different figures refer to the corresponding parts, in which.

DETAILED DESCRIPTION

While the making and using of various embodiments of the present invention are discussed herein in terms of a switched capacitor mixer circuit including specific transistors, it should be appreciated that the present invention provides many inventive concepts that can be embodied in a wide variety of contexts. The specific embodiments discussed herein are merely illustrative of specific ways to make and use the invention, and are not meant to limit the scope of the invention.

By implementing the sampling process at the AC ground node, rather than at the signal side, and adding a gated transistor in the signal path, the present invention significantly reduces the interdependency between gain and linearity in a switched capacitor mixer circuit, supplies higher power without sacrificing area and simplifies the implementation of the RF switch. Charge boosting circuitry allows a reduction in the effective size of the series switch that follows the transconductance element. The present invention achieves high gain and high linearity from the LNA-mixer combination while keeping the size of the RF switches very small, thereby reducing the parasitic effects. An innovative technique for practical implementation of the sampled domain mixing function at very high RF frequencies (greater than 2.4 GHz) is achieved.

Figure 4:
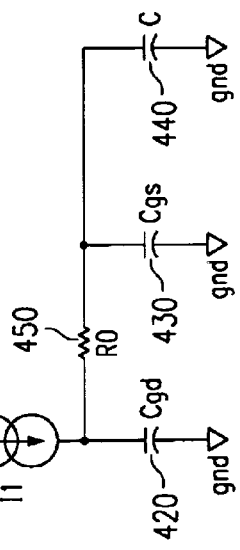
FIG. 4 illustrates a simplified model for a sampling process in accordance with the present invention.

FIG. 4 illustrates a simplified model for a sampling process in accordance with an exemplary embodiment of the present invention. In this model, sampling is current (I1) 410 driven. Therefore, the absolute value of the "on" resistance of the switch is typically not significant except to ensure that the RC time constant of the sampling process is sufficiently greater than 2.4 GHz. The voltage stored on capacitors ($C_{gd}$) 420, ($C_{gs}$) 430 and (C) 440 can then be expressed as:

$$V_0(s) = I(s) * \frac{1}{s(C+C_{gs}) + sC_{gd}(1+sR_0(C+C_{gs}))}$$

In an ideal situation, $C_{gs}=C_{gd}=0$, resulting in:

$$V_0 = \frac{I}{Cj\omega}$$

The non-linearity of the first equation results from the fact that resistor ($R_0$) 450, $C_{gs}$ 430, and $C_{gd}$ 420 are all signal dependent non-linear components. Therefore, with a change in the magnitude of the mixer input signal, the absolute value of the parasitics and the stored voltage in capacitors $C_{gd}$ 420, $C_{gs}$ 430 and C 440 change. This causes significant distortion components. By eliminating the signal dependent parameter from the first equation, a reduction in distortion can be achieved.

Figure 1:
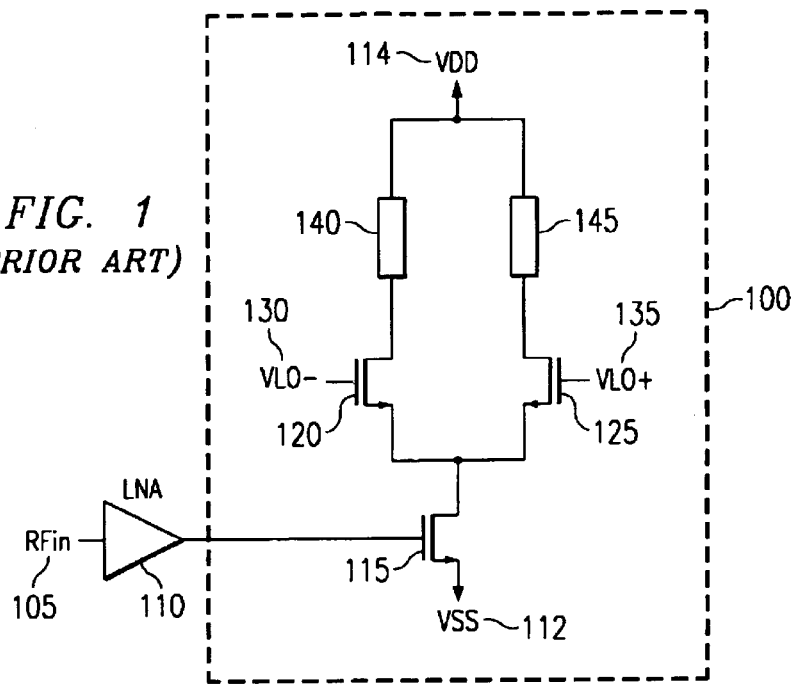
FIG. 1 diagrammatically illustrates the basic architecture of a conventional continuous-time single balanced Gilbert cell mixer.
Figure 3:
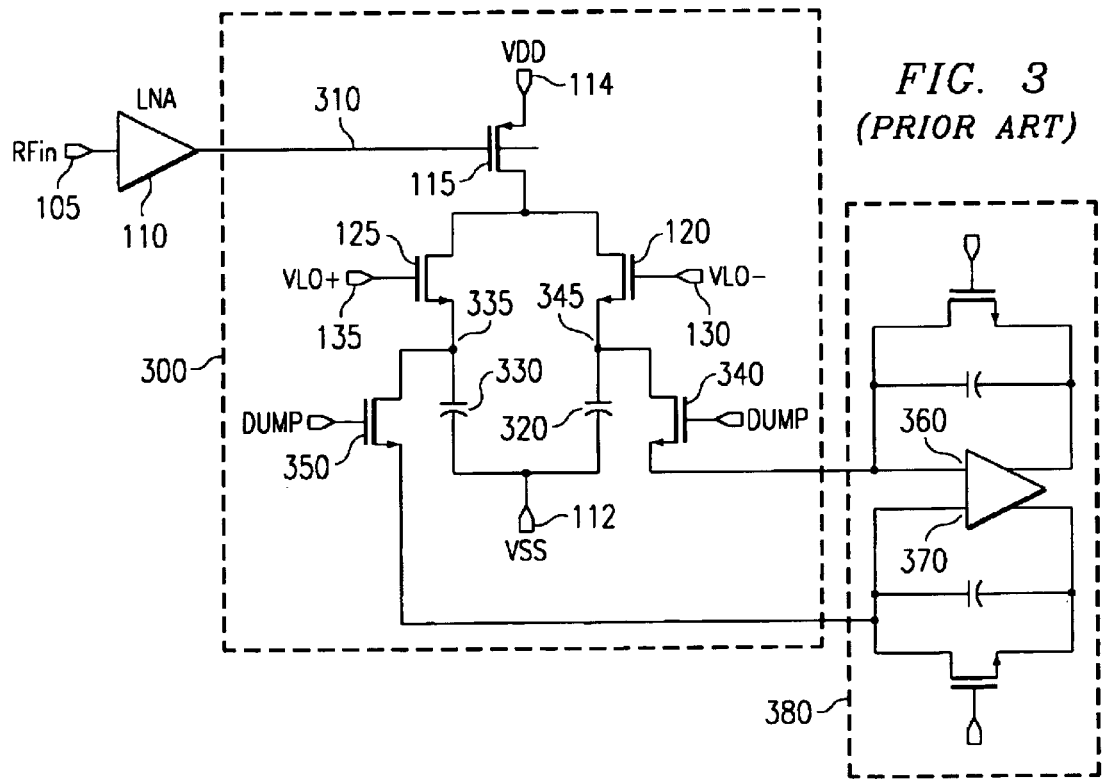
FIG. 3 diagrammatically illustrates a conventional approach to implementing the mixer in a switched capacitance domain.
Figure 2:
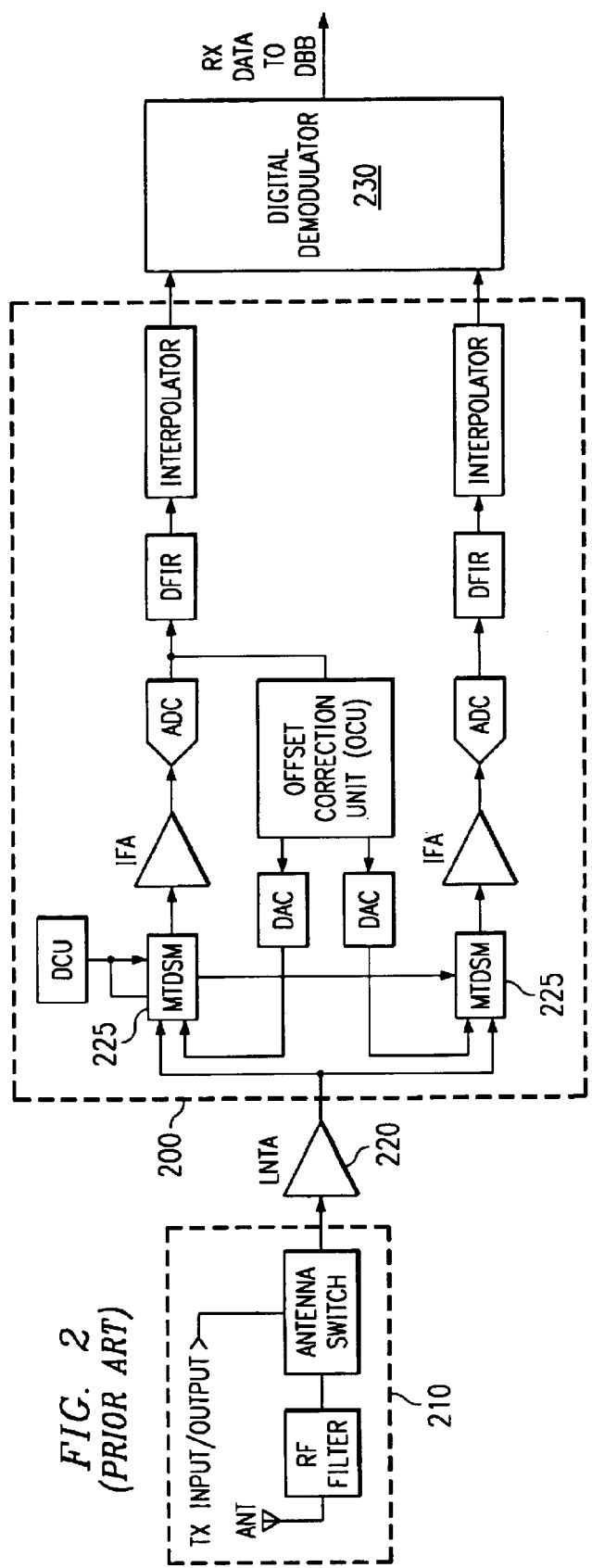
FIG. 2 is a block diagram of a sampling architecture using a conventional switched capacitor approach.
Figure 5:
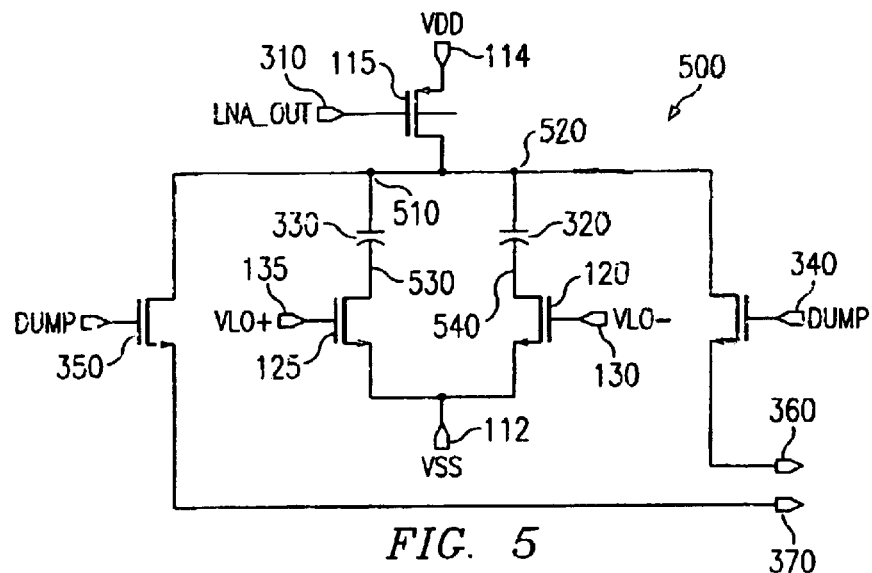
FIG. 5 diagrammatically illustrates a switched capacitor mixer in accordance with an exemplary embodiment of the present invention.

Referring again to mixer 300 of FIG. 3, the actual mixing involves $RF_{in}$ 105, which is present in the output current of transconductance element 115, and the LO frequency which is present in the gate voltages, VLO− 130 and VLO+ 135, of switches 120 and 125, respectively. The mixing operation occurs within an integrated chip wherein the component dimensions are much smaller than the wavelength of $RF_{in}$ 105. Therefore, the wave nature of the Maxwell's equations can be simplified to Kirchoff's current and voltage laws. This means that current input to one terminal of capacitor 320 and 330 is the same as the current output from the other terminal of capacitor 320 and 330, respectively (i.e., no displacement current). The structure of mixer 300 can therefore be modified to mixer 500 of FIG. 5 which diagrammatically illustrates a switched capacitor mixer 500 in accordance with an exemplary embodiment of the present invention. This modification, resulting in the structure of mixer 500, removes almost all the previously discussed problems of a conventional switched capacitor mixer, such as mixer 300.

LNA_OUT 310 is input to transconductance element 115 of mixer 500. Transconductance element 115 can be implemented as a transistor with its gate coupled to LNA_OUT 310 and its source coupled to voltage potential (VDD) 114. The drain of transconductance element 115 is coupled to two (2) parallel capacitors, 320 at node 520 and 330 at node 510. Each capacitor 320 and 330 is in series with a switch, 120 and 125, respectively. Switches 120 and 125 are clocked by VLO− 130 and VLO+ 135, respectively. Switches 120 and 125 can be implemented as transistors with their sources both tied to voltage source (VSS) 112. VLO− 130 is applied to the gate of transistor 120, while VLO+ 135 is applied to the gate of transistor 125. The drain of transistor 120 is tied to capacitor 320 at node 540, while the drain of transistor 125 is tied to capacitor 330 at node 530. The overall integrated charge is transferred to the next stage (not shown) by means of dump switches 340 and 350. Dump 340 is coupled between node 520 and amplifier input 360 (see also FIG. 3). Dump 350 is coupled between node 510 and amplifier input 370. Dumps 340 and 350 can be implemented as transistors with their drains tied to nodes 520 and 510, respectively, and their sources coupled to amplifier inputs 360 and 370, respectively. This architecture is beneficial in that it minimizes the signal swings at nodes 530 and 540. Therefore, the effects of nonlinear parasitics of switches 125 and 120 does not come into consideration.

Although the structure of mixer 500 solves the problem of signal dependency while sampling, a different problem arises. In the clocking scheme of mixer 500, there are two (2) main phases: the sample or mixing phase and the DUMP phase (charge dump to the next stage). During the dump phase, both differential capacitors 320 and 330 will be shorted, losing the differential signal information. In order to prevent this, gated transistors 610 and 620 of FIG. 6 (described below) are placed in the signal path. If gated transistors 610 and 620 are on during the DUMP phase, the charge that gets delivered to the next stage (not shown) will be a combination of the charge sampled during mixing and the input signal. In this case, the gain drops, losing much of the high frequency RF signal present in the output of mixer 500. Therefore, gated transistors 610 and 620 are controlled by an inversion of the dump clock that controls switches 340 and 350.

Figure 6:
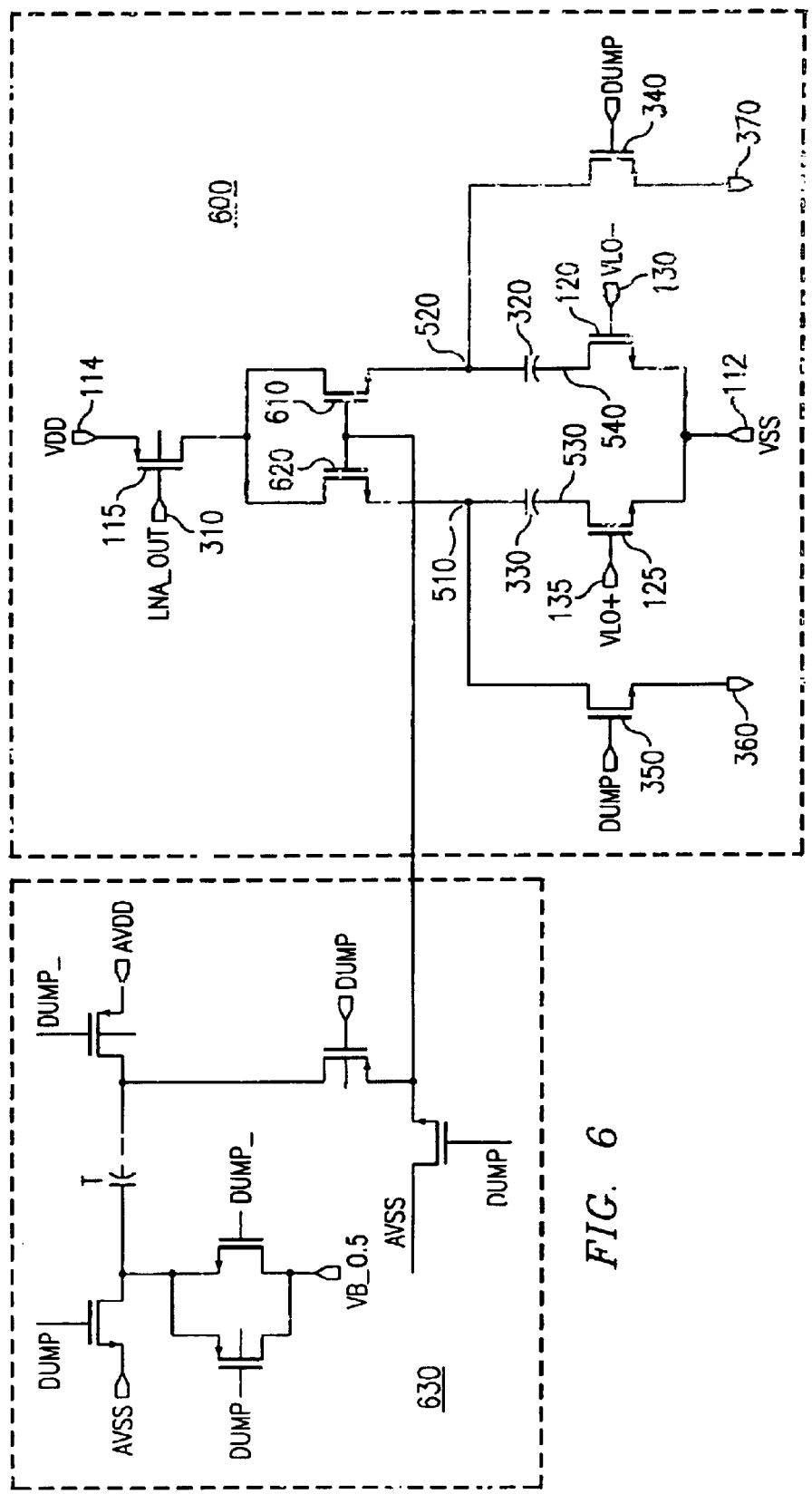
FIG. 6 diagrammatically illustrates a switched capacitor mixer and charge boosting circuitry in accordance with another exemplary embodiment of the present invention.

FIG. 6 diagrammatically illustrates switched capacitor mixer 600 and charge boosting circuitry 630 in accordance with another exemplary embodiment of the present invention. LNA_OUT 310 is input to transconductance element 115 of mixer 500. Transconductance element 115 can be implemented as a transistor with its gate coupled to LNA_OUT 310 and its source coupled to voltage potential (VDD) 114. The drain of transconductance element 115 is coupled to two (2) parallel switches, 610 and 620. Switches 610 and 620 can be implemented as transistors with their sources tied to the drain of transconductance element 115 and their gates tied to charge boosting circuitry 630. The source of transistor 610 is tied to node 520. The source of transistor 620 is tied to node 510. A parallel capacitor, 320 tied to node 520 and 330 tied to node 510, is in series with each switch 610 and 620, respectively. Each capacitor 320 and 330 is in series with a switch, 120 and 125, respectively. Switches 120 and 125 are clocked by VLO− 130 and VLO+ 135, respectively. The drain of transistor 120 is tied to capacitor 320, while the drain of transistor 125 is tied to capacitor 330. The overall integrated charge is transferred to the next stage (not shown) by means of dump switches 340 and 350.

Mixer 600 contains only one switch set that is operating at the sampling frequency. Series switches 610 and 620 after transconductance element 115 are at baseband frequency. A higher voltage at the gate means a greater voltage from gate to source. This results in less series resistance. Therefore, the gates of switches 610 and 620 can be easily boosted (also called constant DC boosting) through the use of charge boosting circuitry 630 in order to reduce the effective size of switches 610 and 620. The absolute value of the resistance of switches 610 and 620 is also reduced due to the $V_{gs}$ overdrive.

The exemplary embodiment of FIG. 6 significantly reduces the gain limitation of the LNA-mixer combination. The absolute voltage at the input of mixer 600 can be sufficiently high since the mixing, or sampling, process occurs at the AC ground node instead of at the signal side. The maximum signal voltage that can be stored on capacitors 320 and 330 can be as high as 1V peak (instead of 50 mV as in the conventional case). The effect due to the non-linear resistance and capacitance of switches 120 and 125 is reduced by having switches 610 and 620 before capacitors 320 and 330, respectively, because switches 610 and 620 can be boosted to a higher voltage due to their operation at a lower frequency. The signal dependant LO feed-through is almost totally removed because there is no RF or AC voltage present at switches 120 and 125. It is an AC signal ground. Finally, the matching requirement of two (2) differentially placed switches 120 and 125 are reduced due to the reduction of signal dependency while sampling and the reduction of parasitics due to smaller switches 120 and 125. This makes the implementation of the RF switch at frequencies such as 2.4 GHz significantly easier.

Figure 7:
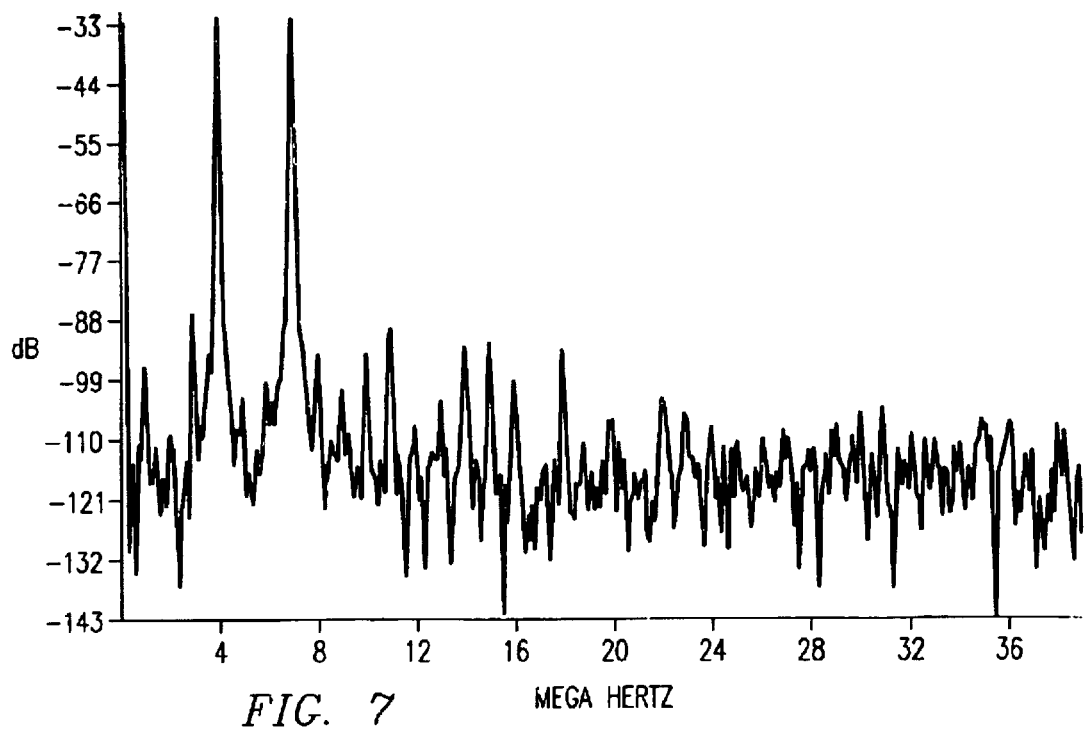
FIG. 7 illustrates a response of the mixer and charge boosting circuitry of FIG. 6 to a two-tone test.

FIG. 7 illustrates a response of mixer 600 and charge boosting circuitry 630 to a two-tone test for 2.404 and 2.407 GHz signals. After mixing, these signals create an intermodulation component which is at 1 MHz (2w1−w2). This results in a third order intermodulation component which is 60 dB down. The performance is measured for the case when the peak-to-peak signal at the input of mixer 600 is as high as 1 volt.

Although exemplary embodiments of the present invention have been described in detail, it will be understood by those skilled in the art that various modifications can be made therein without departing from the spirit and scope of the invention as set forth in the appended claims.

What is claimed is:

1. A switched capacitor mixer circuit, comprising:
   a transconductance element having an input tied to a supply voltage node and an output coupled to a first node, said output further coupled to a second node;
   a first capacitor tied to said first node;
   a second capacitor tied to said second node;
   a first switch coupled to said first capacitor, said first switch further tied to an AC ground node;
   a second switch coupled to said second capacitor, said second switch further tied to said AC ground node;
   a third switch tied to said first node, said third switch further tied to a first output node; and
   a fourth switch tied to said second node, said fourth switch further tied to a second output node.

2. The switched capacitor mixer circuit of claim 1, further including:
   a fifth switch coupled between the output of said transconductance element and said first node; and
   a sixth switch coupled between the output of said transconductance element and said second node.

3. The switched capacitor mixer circuit of claim 2 wherein said fifth and sixth switches include respective control inputs that are tied to a third node.

4. The switched capacitor mixer circuit of claim 3, further including a charge boosting circuit coupled to said third node.

5. The switched capacitor mixer circuit of claim 3 wherein said fifth switch includes a transistor having a drain coupled to the output of said transconductance element, a source tied to said first node and a gate tied to said third node.

6. The switched capacitor mixer circuit of claim 3 wherein said sixth switch includes a transistor having a drain coupled to the output of said transconductance element, a source tied to said second node and a gate tied to said third node.

7. The switched capacitor mixer circuit of claim 1 wherein said transconductance element includes a transistor having a source coupled to said supply voltage node, and a drain coupled to said first and second nodes.

8. The switched capacitor mixer circuit of claim 1 wherein said first switch includes a transistor having a drain coupled to said first capacitor, and a source tied to said AC ground node.

9. The switched capacitor mixer circuit of claim 1 wherein said second switch includes a transistor having a drain coupled to said second capacitor, and a source tied to said AC ground node.

10. The switched capacitor mixer circuit of claim 1 wherein said third switch is a transistor having a drain tied to said first node, a source tied to said first output node and a gate.

11. The switched capacitor mixer circuit of claim 1 wherein said fourth switch is a transistor having a drain tied to said second node, a source tied to said second output node and a gate.

* * * * *